US009112537B2

United States Patent
Ramirez et al.

(10) Patent No.: US 9,112,537 B2
(45) Date of Patent: Aug. 18, 2015

(54) CONTENT-AWARE CACHES FOR RELIABILITY

(75) Inventors: Tanausu Ramirez, Barcelona (ES); Javier Carretero Casado, Barcelona (ES); Enric Herrero, Cardedeu (ES); Matteo Monchiero, Menlo Park, CA (US); Xavier Vera, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 104 days.

(21) Appl. No.: 13/992,504

(22) PCT Filed: Dec. 22, 2011

(86) PCT No.: PCT/US2011/066912
§ 371 (c)(1),
(2), (4) Date: Jun. 7, 2013

(87) PCT Pub. No.: WO2013/095525
PCT Pub. Date: Jun. 27, 2013

(65) Prior Publication Data
US 2014/0019823 A1      Jan. 16, 2014

(51) Int. Cl.
| H03M 13/29 | (2006.01) |
| G06F 11/10 | (2006.01) |
| G06F 1/32 | (2006.01) |
| H03M 13/09 | (2006.01) |
| H03M 13/35 | (2006.01) |
| G06F 12/08 | (2006.01) |

(52) U.S. Cl.
CPC ......... *H03M 13/2906* (2013.01); *G06F 1/3275* (2013.01); *G06F 1/3296* (2013.01); *G06F 11/1064* (2013.01); *G06F 12/0895* (2013.01); *H03M 13/09* (2013.01); *H03M 13/356* (2013.01); *Y02B 60/1228* (2013.01); *Y02B 60/1285* (2013.01)

(58) Field of Classification Search
CPC .................................................. G06F 11/1076
USPC .................................. 714/763, 755, 723, 8, 6
See application file for complete search history.

(56) References Cited

U.S. PATENT DOCUMENTS

| 5,434,992 A | 7/1995 | Mattson |
| 6,804,799 B2 | 10/2004 | Zuraski, Jr. |
| 8,266,498 B2 | 9/2012 | Moyer |
| 2009/0300293 A1 | 12/2009 | Mantor et al. |
| 2011/0047408 A1* | 2/2011 | Gille et al. ........................ 714/6 |
| 2011/0047411 A1* | 2/2011 | Gille ................................ 714/8 |

OTHER PUBLICATIONS

PCT International Search Report for PCT Counterpart Application No. PCT/US2011/066912, 3 pgs., (Sep. 27, 2012).
PCT Written Opinion of the International Searching Authority for PCT Counterpart Application No. PCT/US2011/066912, 4 pgs., (Sep. 27, 2012).
PCT Notification concerning Transmittal of International Preliminary Report on Patentability (Chapter I of the Patent Cooperation Treaty) for PCT Counterpart Application No. PCT/US2011/066912, 6 pgs., (Jul. 3, 2014).

* cited by examiner

*Primary Examiner* — Fritz Alphonse
(74) *Attorney, Agent, or Firm* — Nicholson De Vos Webster & Elliott LLP

(57) ABSTRACT

Embodiments of systems, apparatuses, and methods for reducing data cache power consumption and error protection overhead are described. In some embodiments, the data cache is partitioned into cache portions. Each cache portion stores data that has a different fault tolerance and uses a different type of error detection mechanism than the other cache portions.

22 Claims, 13 Drawing Sheets

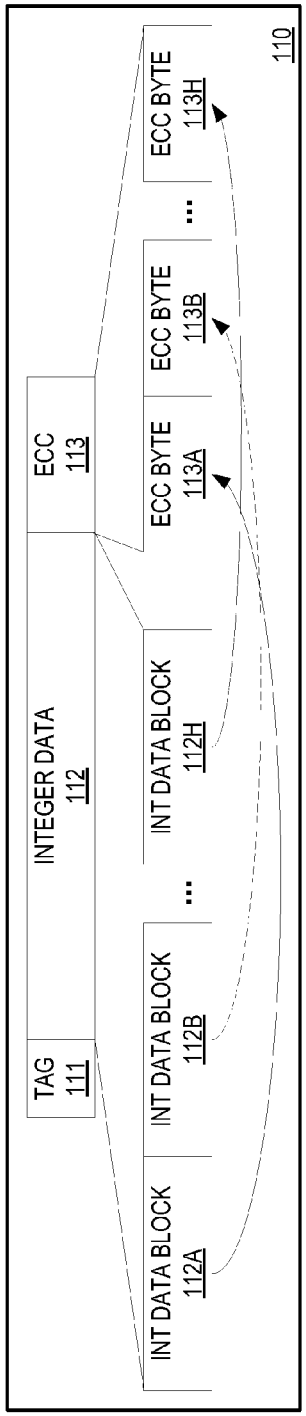
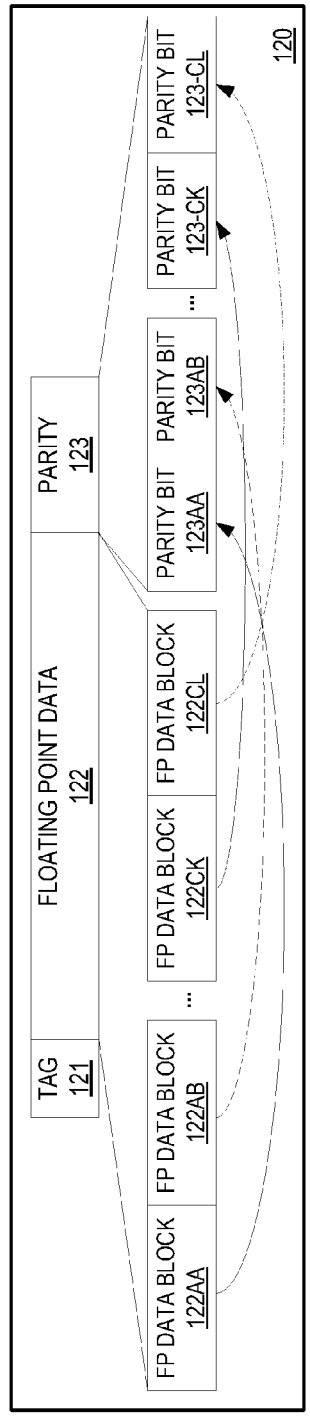
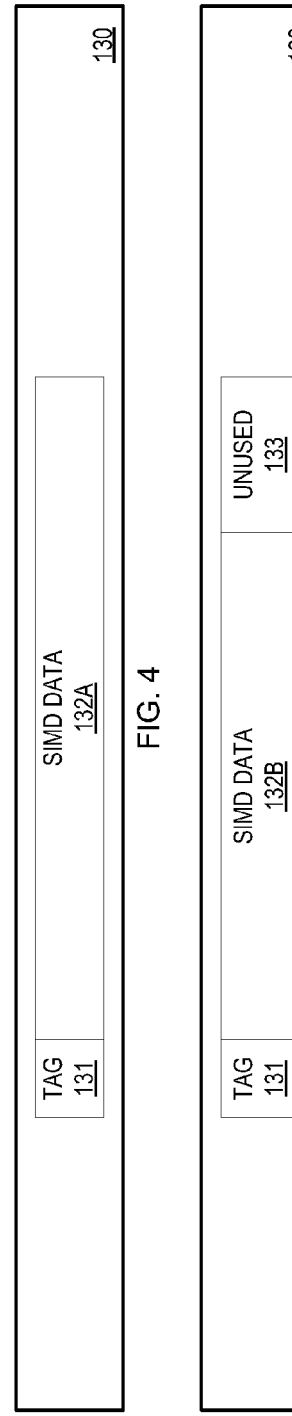
FIG. 2
FIG. 3
FIG. 4
FIG. 5

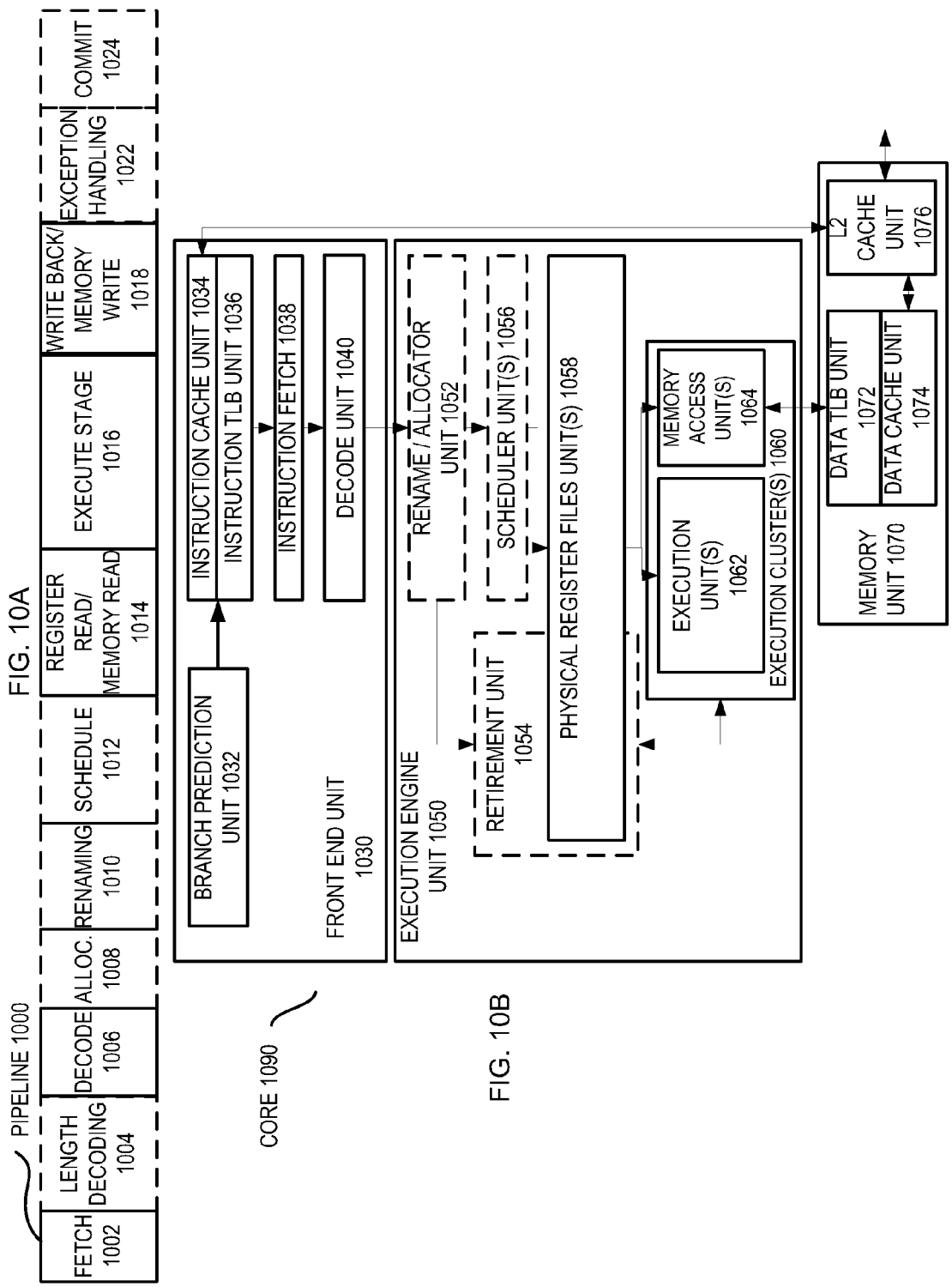

US 9,112,537 B2

CONTENT-AWARE CACHES FOR RELIABILITY

CROSS-REFERENCE TO RELATED APPLICATION

This patent application is a U.S. National Phase Application under 35 U.S.C. §371 of International Application No. PCT/US2011/066912, filed Dec. 22, 2011, entitled CONTENT-AWARE CACHES FOR RELIABILITY.

BACKGROUND

One way of mitigating the effects of soft errors in data storage memory structures in microprocessors, such as cache memories, is to use error detection mechanisms such as Error Correcting Codes ("ECC") to detect and, in some cases, correct soft errors when they occur. Soft errors may occur when high-energy alpha particles strike a memory cell and cause the memory cell to change state to a different value. Because alpha particles are charged particles, the amount of electrical charge stored in a memory cell may change when alpha particles strike the memory cell. If the charge alteration in the memory cell is sufficiently large, the voltage on the memory cell may change from a level that represents one logic state to a level that represents a different logic state, in which case the information stored in that memory cell becomes corrupted. Generally, soft error rates increase as circuit dimensions decrease, because the likelihood that an alpha particle will strike a memory cell increases when the circuit density increases. Moreover, caches are especially vulnerable to soft errors because caches typically span a large area of a microprocessor, and hence increasing the probability that an alpha particle will strike somewhere in the cache of the microprocessor.

An ECC error detection mechanism uses a coding algorithm such as a Hamming code to encode information about a block of memory contents into ECC bits that contain sufficient details about the memory contents to permit recovery of errors in the memory contents. Depending on the specific implementation, the level of detection or correction capability may be limited to one or two bit errors. While the use of ECC error detection mechanism may increase data reliability, it comes at the costs of addition circuitry to compute the ECC bits, additional memory to store the ECC bits, a reduction in performance due to the additional time needed to perform the error detection and/or correction operations, and an increase in power consumption associated with performing the error detection and/or correction operations.

BRIEF DESCRIPTION OF THE DRAWINGS

FIG. 2 illustrates a cache line, according to one embodiment of the invention.

FIG. 3 illustrates a different cache line, according to one embodiment of the invention.

FIG. 4 illustrates another cache line, according to one embodiment of the invention.

FIG. 5 illustrates another cache line, according to a different embodiment of the invention.

FIG. 10A illustrates a block diagram illustrating both an exemplary in-order pipeline and an exemplary register renaming, out-of-order issue/execution pipeline according to embodiments of the invention.

FIG. 10B illustrates a block diagram illustrating both an exemplary embodiment of an in-order architecture core and an exemplary register renaming, out-of-order issue/execution architecture core to be included in a processor according to embodiments of the invention

DETAILED DESCRIPTION

Figure 1:
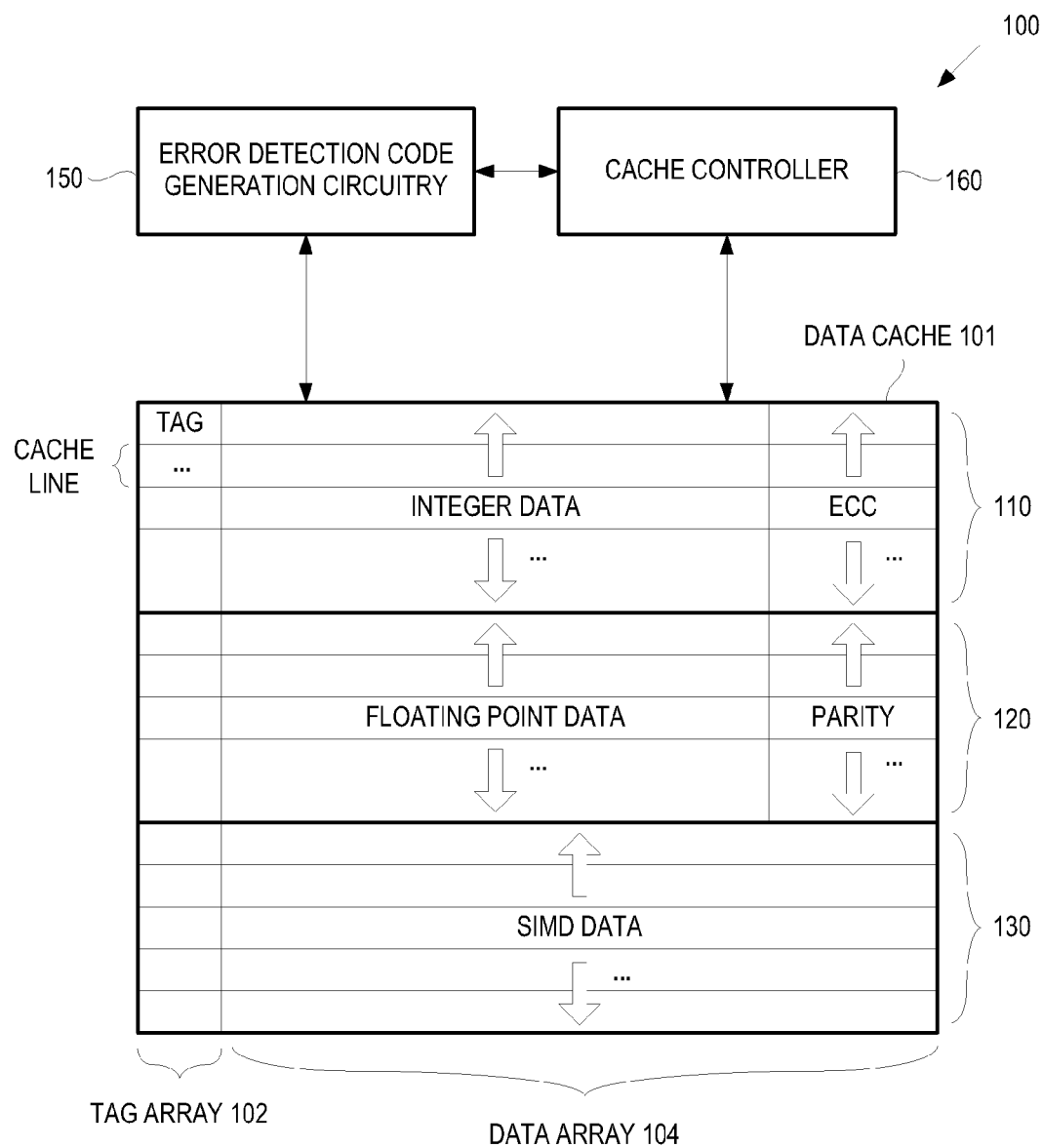
FIG. 1 illustrates a block diagram of a data cache unit, according to embodiments of the invention.

In the following description, numerous specific details are set forth. However, it is understood that embodiments of the invention may be practiced without these specific details. In other instances, well-known circuits, structures and techniques have not been shown in detail in order not to obscure the understanding of this description.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Implementing an Error Correcting Code ("ECC") error detection mechanism requires additional hardware to generate the ECCs and to perform, when applicable, error correction. Additional storage elements are required as well to store the ECCs. The ECC error detection mechanism also consumes additional dynamic power when it is being used. Performing the ECC calculation for error detection and performing the error correction also requires additional processing time, which may cause unwanted latencies when performing cache accesses. The additional costs of the error detection overhead in hardware, performance, and power associated with implementing an ECC error detection mechanism for a data cache may be justified when the protected data content is critical information such as data that is critical to program execution. However, certain types of data may be more fault tolerable than others. That is, errors in these certain types of data are not critical to program execution. Hence, the benefits of protecting these more fault tolerable types of data with an ECC error detection mechanism may not outweigh the additional error protection overhead associated with implementing and utilizing the ECC error detection mechanism.

Embodiments of the present invention disclose a cache architecture that partitions a data cache into cache portions based on the fault tolerance of the data to be stored in each cache portion. Each cache portion uses a different error detection mechanism that corresponds to the fault tolerance of the data to be stored in that cache portion. By limiting the application of ECC error detection mechanism to only a portion of the data cache and storing only critical data that requires a high level of error protection in that cache portion, the overall impact of the additional costs of error detection overhead in hardware, performance, and power associated with implementing and utilizing an ECC error detection mechanism can be reduced.

FIG. 1 illustrates a data cache unit 100 according to one embodiment of the present invention. The data cache unit 100 includes a data cache 101. In one embodiment, the data cache 101 is a first-level data cache, such as a level 0 (L0) or level 1 (L1) data cache. In other embodiments, the data cache 101 can be a mid-level data cache, such as level 2 (L2), level 3 (L3), level 4 (L4), or other levels of data cache, a last level cache (LLC), and/or combinations thereof. The data cache 101 includes a tag array 102 to store tags and a data array 104 to store data. Each cache line in data cache 101 includes a tag from the tag array 102 and data associated with that tag from the data array 104. The data cache 100 may also include a status array (not shown) to indicate the status of each cache line (e.g., valid, dirty, etc.). In one embodiment, the data cache 101 is partitioned into three cache portions 110, 120, and 130. The cache portions are partitioned based on the fault tolerance of the data to be stored in each cache portion. Hence, each cache portion is used to store data that has a different level of error protection than the data stored in the other cache portions, and the data in each cache portion is protected by a type of error detection mechanism with a corresponding type of error detection code that is different than the error protection mechanism used in the other cache portions.

In one embodiment, the cache portion 110 is configured to store critical data that requires a high level of error protection with a type of error detection code that provides for both error correction and error detection. The cache portion 120 is configured to store medium-protected data that requires a medium level of protection with a type of error detection code that provides for error detection without error correction. The cache portion 130 is configured to store non-protected data that does not require any error detection or correction. The data cache unit 100 includes an error detection code generation circuitry 150 coupled to the data cache 101 to generate at least one of the types of error detection codes that are used to protect the respective data in the cache portions 110 and 120. The data cache unit 100 also includes a cache controller 160 that is coupled to the error detection code generation circuitry 150 and the data cache 101 to identify and apply the proper error detection mechanism on cache accesses corresponding to the respective cache portion that is being accessed.

In accordance with one embodiment of the present invention, the cache portion 110 is configured to store integer data, and the type of error detection code protecting the integer data in the cache portion 110 is an Error Correcting Code (ECC). Integer data can be critical for program execution. For example, when integer data is being used as stack pointers or loop variables, errors in the integer data can cause incorrect pointer results, accesses to protected memory regions, unexpected exceptions, or even deadlock resulting in program crashes. Hence, integer data is given a high level of error protection because integer data has a low fault tolerance, and errors in integer data should both be detected, and if possible, corrected to prevent program crashes. As such, an ECC error detection mechanism that can both detect and correct errors is used to protect the integer data stored in the cache portion 110.

The cache portion 110 may be organized into cache lines having a tag 111 and a data portion that includes integer data 112 and ECC 113 as shown in FIG. 2. In an exemplary embodiment, for each cache line, the integer data 112 may have 64 bytes. Each 64-byte of integer data 112 in a cache line may be sub-divided into eight 64-bit integer data blocks 112A-112H. In one embodiment, the ECC error detection mechanism that is used is a Single-bit Error Correction and Double-bit Error Detection (SECDED) ECC. For each of the 64-bit integer data blocks 112A-112H, an 8-bit ECC byte 113A-113H is computed over the corresponding integer data blocks 112A-112H. Hence, each cache line of 64 bytes of integer data 112 is protected by 8 ECC bytes 113A-113H. In one embodiment, the ECC bytes 113A-113H are computed when integer data is loaded into the cache line and stored together with the integer data blocks 112A-112H in each cache line in the cache portion 110. This requires that the cache portion 110 to be sized accordingly to accommodate the additional bits required for the ECC bytes. In an alternative embodiment, the ECC bytes 113A-113H can be stored in an off-cache memory.

When a cache line in the cache portion 110 is accessed, the cache controller 160 determines that the error detection mechanism used to protect the data in cache portion 110 is an ECC error detection mechanism. The error detection code generation circuitry 150 calculates the corresponding ECC byte(s) on the contents of the requested integer data block(s) in the cache line, and performs a bit-wise comparison of the calculated ECC byte(s) with the corresponding stored ECC byte(s). The bit-wise comparison can be performed, for example, by XOR gates. If a single-bit error is detected, the data contents of the requested integer data block(s) are corrected. If errors in the particular requested integer data would have caused a program to crash, the error correction that is performed upon detecting a single-bit error allows program execution to continue. If multiple error bits are detected in a single integer data block, an exception or an interrupt event can be generated to indicate an uncorrectable error has been detected, and program execution may be disrupted depending on the purpose and usage of the requested integer data to allow a processor to take proper actions. Although additional processing time and dynamic power consumption is required to perform the ECC calculation and, when applicable, error correction on the integer data stored in cache portion 110, the benefits of preventing program crashes on single-bit errors justifies the additional costs in error detection overhead associated with implementing the ECC error detection mechanism to protect the integer data stored in the cache portion 110.

Referring back to FIG. 1, in one embodiment, the cache portion 120 of data cache 101 is configured to store floating-point (FP) data, and the type of error detection code protecting the FP data in the cache portion 120 is a parity bit. FP data is typically used for complex mathematical operations, for example, in some digital signal processing applications, scientific simulations, and statistical analysis. Errors in FP data typically do not cause programs to crash. Instead, errors in FP data typically result in erroneous data computations, for example, precision errors, that do not affect program execution. Hence, FP data is given a medium level of protection because FP data is more fault tolerable than integer data, and errors in FP data should be detected but not necessarily corrected. As such, a parity bit error detection mechanism is used to protect the FP data stored in cache portion 120.

Similar to cache portion 110, the cache portion 120 may be organized into cache lines having a tag 121 and a data portion that includes FP data 122 and parity bits 123 as shown in FIG. 3. In an exemplary embodiment, for each cache line, FP data 122 may have 64 bytes. Each 64-byte of FP data 122 may be sub-divided into smaller FP data blocks. A parity bit is computed over each FP data block. In one embodiment, each 64-byte of FP data 122 is sub-divided into sixty-four 8-bit FP data blocks 122AA-122CL, and 64 parity bits 123AA-123CL (one parity bit per 8-bit FP data block) are computed for each cache line. In one embodiment, the parity bits 123AA-123CL are stored together with the FP data blocks 122AA-122CL in each cache line in the cache portion 120. This requires that the cache portion 120 to be sized accordingly to accommodate the additional parity bits. Note that in this exemplary embodiment, the size of the FP data blocks 122AA-122CL in each cache line in cache portion 120 is selected to be 8 bits each such that the number of parity bits for each cache line in cache portion 120 is the same as the total number of ECC bits for each cache line in cache portion 110. Keeping the number of additional bits required for the respective error detection codes in cache portion 120 to be consistent with cache portion 110 allows for a simpler physical implementation of the data cache 100, because a single SRAM can be used to implement both cache portions without wasting any memory locations due to mismatches in the number of additional error detection code bits between the different cache portions. Nevertheless, in other embodiments, the FP data 122 in each cache line in cache portion 120 can be sub-divided into other FP data block sizes. The number of additional bits required for the parity bit error detection mechanism would be one parity bit per FP data block. In an alternative embodiment, the parity bits 123AA-123CL can be stored in an off-cache memory.

When a cache line in cache portion 120 is accessed, the cache controller 160 determines that the error detection mechanism used to protect the data in cache portion 120 is a parity bit error detection mechanism. The parity bit(s) corresponding to the contents of the requested FP data block(s) in the cache line is calculated, and a comparison of the calculated parity bit(s) is compared with the stored parity bit(s). The comparison can be performed, for example, by an XOR gate. If a parity error is detected for a requested FP data block, an exception or an interrupt event can be generated to indicate an error has been detected, and program execution may be disrupted depending on the purpose and usage of the requested floating point data to allow a processor to take proper actions. In one embodiment, the parity bit calculation is implemented as an XOR sum of the data bits in a single FP data block. By implementing a parity bit error detection mechanism instead of an ECC error detection mechanism to protect the FP data 122 stored in the cache portion 120, the additional dynamic power consumption and latency associated with ECC computations can be reduced when accessing FP data. Because a parity bit calculation is a much simpler computation and requires less power and processing time to compute, the overall performance and dynamic power consumption of the data cache unit 100 can be improved when the FP data in the cache portion 120 is accessed without utilizing an ECC error detection mechanism.

Referring back to FIG. 1, in one embodiment, the cache portion 130 of the data cache 101 is configured to store unprotected multimedia Single Instruction Multiple Data (SIMD) data without using any error detection mechanism or any error detection codes to protect the SIMD data. SIMD data is typically used for multimedia applications such as real-time gaming and video processing. Errors in SIMD data typically do not cause programs to crash. Instead, errors in SIMD data typically produce wrong pixels in a video frame or a lower image quality, and do not affect program execution. Hence, SIMD data is given a low level of protection because SIMD data has a high fault tolerance, and detection of errors in SIMD data may not be necessary. As such, SIMD data can be accessed in cache portion 130 without using any error detection mechanism. Hence, the SIMD data in cache portion 130 can be stored without any error detection codes to protect the SIMD data. Because SIMD data errors are typically inconsequential with respect to program execution, the additional dynamic power consumption and latency associated with any error detection mechanism can be eliminated when SIMD data is being accessed to improve the overall performance and dynamic power consumption of the data cache unit 100.

Recall that in one exemplary embodiment, the cache portions 110 and 120 have cache lines having a data portion with 64 bytes of data and 64 bits of error detection code bits per cache line. Because cache portion 130 does not use any error detection codes to protect the SIMD data stored in the cache portion 130, the cache portion 130 can be organized as cache lines with a data portion that has 72 bytes of SIMD data 132A each as shown in FIG. 4 to keep the total number of bits per cache line consistent with the cache portions 110 and 120. As mentioned above, this allows the data cache 101 to be implemented as a single SRAM without leaving any memory locations unused. In other embodiments, the cache portion 130 can be organized as cache lines with a data portion that has a different SIMD data size. For example, as shown in FIG. 5, each cache line in cache portion 130 may have a data portion with 64 bytes of SIMD data 132B with 8 bytes of unused memory locations 133.

Referring back to FIG. 1, while the embodiment as shown illustrates the data cache 101 as having a flat architecture, it should be noted that embodiments of the present invention can also be applied to data caches that are organized into cache sets. In such embodiments, the partitioning scheme as described above is applied to each cache set. For example, in one exemplary embodiment, each cache set would have a cache portion 110 for storing integer data that is protected by ECC error detection codes, a cache portion 120 for storing FP data that is protected by parity bits, and a cache portion 130 for storing unprotected SIMD data.

In accordance with one embodiment of the present invention, in order for the cache controller 160 to identify which cache portion is being accessed for a particular memory operation and to determine which error detection mechanism should be applied to that cache access, a data-type ("DT") flag in a page table entry is used. Each cache portion has a unique data-type identifier to identify the particular cache portion as to the type of data (i.e. the fault tolerance of the data) being stored in that cache portion and the type of error detection mechanism being used to protect that data. The data-type identifier is stored in the data-type flag in page table entries in a page table. The data-type flag is also stored in translation look-aside buffer ("TLB") entries (which are recently used page table entries) in a TLB structure. As explained below, this data-type flag is used during virtual-to-physical address translation lookups to determine which cache portion is being accessed for a particular memory operation, such that the cache controller 160 is aware of the type of error detection mechanism that should be applied to the particular cache access.

Figure 6:
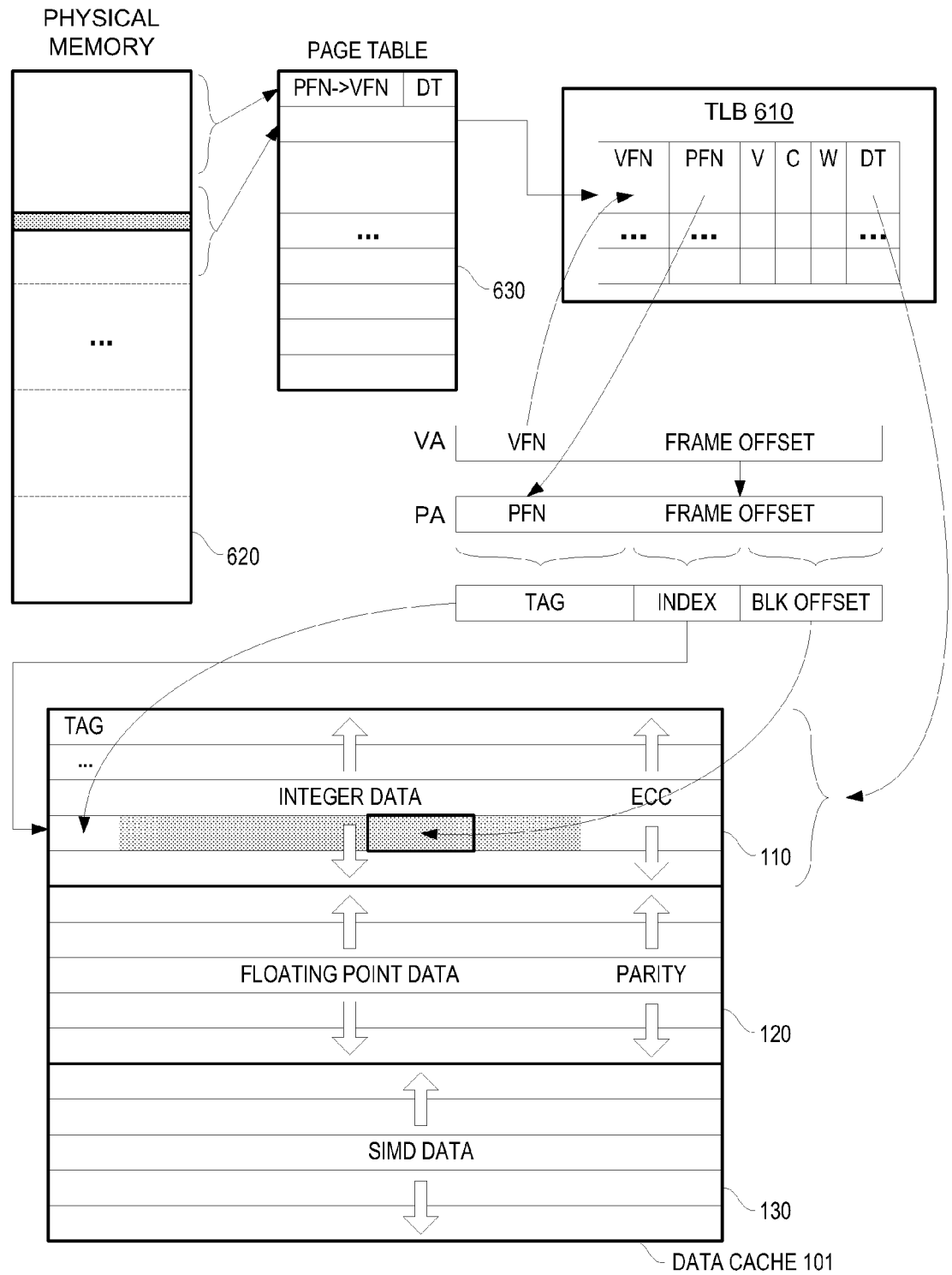
FIG. 6 illustrates a conceptual block diagram of a data cache access, according to one embodiment of the invention.

FIG. 6 illustrates a conceptual block diagram of a cache access to the data cache 101 according to one embodiment of the present invention. The physical memory 620 is divided into memory pages, also referred to as page frames as shown by the dotted lines in the physical memory 620. When a process (e.g., an instance of a computer program being executed) requests memory to be allocated to the process, the compiler or the operating system (OS) allocates one or more pages of physical memory to the virtual memory space of the process. Each page frame of the physical memory has a physical frame number (PFN) that is used to address the page frame. A page frame is allocated to a process by mapping a virtual frame number (VFN) of the virtual memory space of the process to the physical frame number (PFN) of the page frame. The VFN to PFN mapping for each page frame is stored in a page table entry in a page table 630.

In an embodiment of the present invention, when the compiler or OS performs the memory allocation, the compiler or OS also determines the error detection mechanism corresponding to the level of error protection that should be applied to the data associated with the particular page frame that is being allocated. The particular error detection mechanism for each page frame is determined based on the fault tolerance of the data being used by the process. Depending on the error detection mechanism, the data-type identifier corresponding to the cache portion that uses that particular error detection mechanism is associated with the VFN to PFN mapping of the page frame. This data-type identifier is stored in a data-type flag together with the VFN to PFN mapping in a page table entry in the page table 630.

It should be noted that when the compiler or the OS allocates more than one page frame to a process, not every page frame that is being allocated need to be associated with the same data-type identifier. In other words, each page frame can be independently associated its own data-type identifier and uses its own error detection mechanism independent of the other page frames that are being allocated. However, for an individual page frame, there can be only one data-type identifier associated with that page frame, and only one type of error detection mechanism to protect the data associated with that page frame. Hence, the use of the data-type flag to identify which of the cache portions 110, 120, and 130 is being accessed for memory operations associated with a particular page frame allows for mapping of data to a particular cache portion at the page frame granularity.

When a process performs a memory operation with address translation enabled, the memory operation references a memory location using a virtual address ("VA"). A virtual address has a VFN portion and a frame offset portion. In order to carry out the memory operation, the virtual address is translated into a physical address to access the data cache 101 and/or the physical memory 620. The physical address of a memory operation can be determined by taking the VFN portion of the virtual address, translating the VFN into the PFN based on the VFN to PFN mapping as indicated in the page table 630, and combining the PFN with the frame offset portion of the virtual address.

Instead of having to access the page table 630 every time a memory operation takes place, recently used page table entries are stored as TLB entries in a smaller translation look-aside buffer ("TLB") 610 to enable faster virtual-to-physical address translation lookups. A page table entry is loaded into the TLB 610 when a TLB miss occurs, that is when a memory operation requires a virtual-to-physical address translation that is not available in the TLB 610. On a TLB miss, the VFN portion of the virtual address of the memory operation is used to fetch the page table entry associated with the virtual address from the page table 630. The fetched page table entry includes the PFN that is mapped to the VFN together with the data-type flag associated with the page frame. This information is stored in a TLB entry in the TLB 610. A TLB entry includes a VFN, a PFN corresponding to the VFN, a valid ("V") bit to indicate that the TLB entry is valid, a cacheable ("C") bit to indicate that the page frame can be cached, a writable ("W") bit to indicate whether the TLB entry is writable, and a data-type ("DT") bit to identify which of the cache portions 110, 120, and 130 should be accessed for a particular memory operation and which error detection mechanism should be applied to cache accesses associated with the page frame. On subsequent memory operations to virtual addresses that have the same VFN, instead of looking up the virtual-to-physical address translation in the page table entry in the page table 630, the virtual-to-physical address translation can be looked up in the TLB 610.

Once the physical address of a memory operation is determined by looking up the virtual-to-physical address translation in the TLB 610 or page table 630, the physical address can be separated into a tag portion, an index portion, and a block offset portion. The index portion is used to index into a particular cache line, and the tag portion of the physical address is compared to the tag corresponding to the cache line to determine if there is a cache hit. The block offset portion is used to identify which data block(s) within the cache line is being accessed upon a cache hit. The data-type flag associated with the virtual-to-physical address translation of the memory operation as indicated in the page table entry or TLB entry is used to determine which cache portion is being accessed and identifies the type of error detection mechanism that should be applied to the contents of the requested data block(s) of the cache line.

While the embodiment described above allows data mapping to a cache portion at the page frame granularity, in another embodiment, a finer granularity of data mapping can be achieved by using a plurality of address range buffers. In this embodiment, every context (e.g., a process, a task, or an execution thread) has a programmable address range buffer associated with the context that indicates, for each of the cache portions 110, 120, and 130, a range of effective addresses that is mapped to the respective cache portion for the particular context. An effective address is the address that is referenced by a processor instruction. Depending on the addressing mode, an effective address may be a virtual address if address translation is enabled, or an effective address may be a physical address if address translation is disabled. In addition to allowing for a finer granularity of data mapping, the use of address range buffers also differs from the data-type flag embodiment described above in that the address range buffers can be used with or without address translation being enabled. In one embodiment, the address range buffers can be implemented with programmable hardware registers. Alternatively, the address range buffers can be stored in a memory structure.

Figure 7:
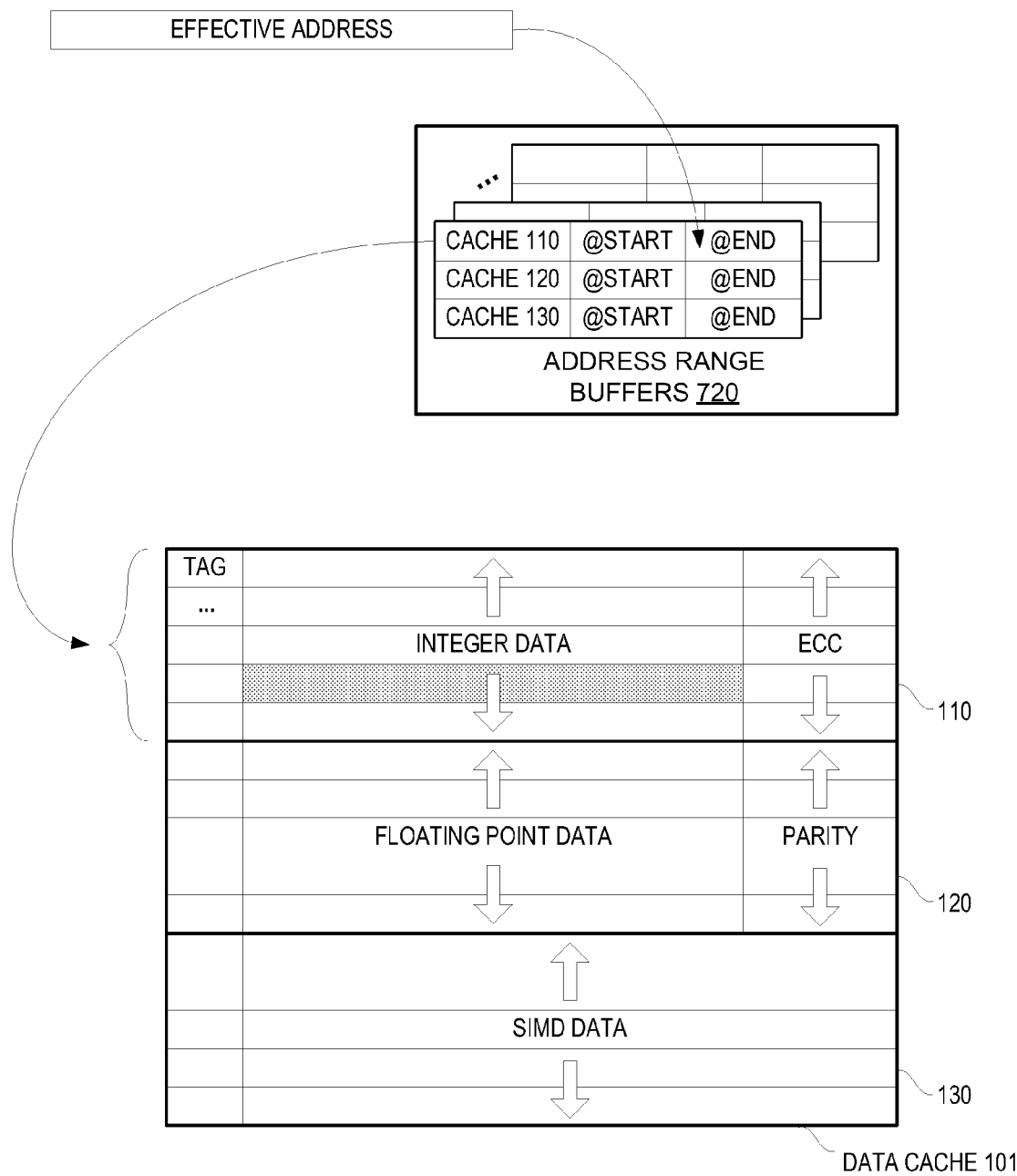
FIG. 7 illustrates a conceptual block diagram of a data cache access, according to another embodiment of the invention.

FIG. 7 illustrates a conceptual block diagram of a cache access to the data cache 100 using address range buffers 720 according to one embodiment of the present invention. When a processor instruction involves a memory operation, the effective address associated with the memory operation is used to look up in the address range buffer, which cache portion is being accessed based on the address range information indicated in the address range buffer corresponding to the current context. Depending on the particular size of the address ranges, the entire effective address need not be used to identify which cache portion's address range that the particular effective address falls within. Instead, a portion of the effective address (e.g., a number of most significant bits of the effective address) can be used to determine the matching address range to identify the corresponding cache portion.

Each of the address range buffers 720 includes a separate address range entry for each of the cache portions 110, 120, and 130. Each address range entry includes a starting effective address and an ending effective address to indicate a range of effective addresses that is mapped to a particular cache portion. Once the address range within which the effective address of a memory operation belongs to is determined, the cache portion that is being accessed can be identified. This information can be used by the cache controller to apply the proper error detection mechanism corresponding to the cache portion that is being accessed. The operations of determining a cache hit using a tag, index, and block offset remains the same as described above, except that instead of using a data-type flag to determine which error detection mechanism should be applied, the error detection mechanism is determined using the address range buffers. Because each of the address range buffers corresponds to a particular context, when a context switch occurs, the address range buffer that is used for the current context also switches accordingly.

The address range buffers 720 can be programmed by code generated by the compiler, or by specific software instructions, such as memory allocate (e.g., "malloc") instructions, added by the programmer in the software code. Because each address range can be programmed to have a minimum range of one effective address (when the starting effective address is the same as the ending effective address), the use of address range buffers 720 allows data mapping to a specific cache portion down to the per address granularity. However, care must be taken to ensure that the programmed address ranges covers all possible effective addresses that a particular context may access. In one embodiment, if an effective address of a memory operation does not correspond to any of the address ranges for a particular context, the effective address can be mapped to a default cache portion, for example, cache portion 130 that does not use any error detection mechanism.

In a further embodiment of the present invention, instead of using a data-type flag or address range buffers to determine which cache portion is being accessed for a particular memory operation and which type of error correction mechanism should be applied to the cache access, protection-level specific memory instructions can be added to the instruction set architecture (ISA) in order to map the effective address of an instruction to a target cache portion. In such an embodiment, the processor has knowledge of which cache portion should be accessed based on the particular protection-level specific memory instruction. A hardware decoder decodes the protection-level specific memory instructions, and execution logic coupled to the hardware decoder performs accesses to the cache portions corresponding to level of error protection as indicated by the protection-level specific memory instructions. For example, an ECC-protected load instruction and an ECC-protected store instruction can be added to the ISA to specifically indicate that these load and store operations are directed to the cache portion 110 which uses the ECC error detection mechanism. A parity-bit-protected load instruction and a parity-bit-protected store instruction can be added to the ISA to specifically indicate that theses load and store operations are directed to the cache portion 120 which uses the parity-bit error detection mechanism. Additionally, a non-protected load instruction and a non-protect store instruction can be added to the ISA to specifically indicate that these load and store operations are directed to the cache portion 130 which does not use any error detection mechanism.

While this embodiment provides a straight forward way to identify the target cache for a particular memory operation, this allows for the possibility that an effective address may be mapped to multiple cache portions when the same effective address is referenced by multiple protection-level specific memory instructions with different error-protection levels during program execution. This may cause data for the same effective address to be stored in multiple cache portions to create potential coherency problems among the stored data associated that particular effective address in the multiple cache portions. Hence, the programmer or the compiler should map an effective address to only one cache portion (i.e. associate each effective address to only one set of protection-level specific memory instructions that have the same error-protection level) to avoid such potential coherency problems.

Referring back to FIG. 1, while the embodiment as shown illustrates the cache portions 110, 120, and 130 as having equal sizes, the data cache 100 can be partitioned into cache portions that have different sizes depending on the particular target application. For example, for a general purpose microprocessor, the data cache 101 can be partitioned into equally sized cache portions 110, 120, and 130 as shown. But for a microprocessor intended for graphics intensive applications, for example, for use in a gaming console system, the data cache 101 can be partitioned as having 25% of the data cache 100 allocated to integer data for cache portion 110, 25% of the data cache 101 allocated to FP data for cache portion 120, and 50% of data cache 100 allocated to SIMD data for video processing in cache portion 130. For a microprocessor intended for scientific analysis, for example, for use in a super computer, the data cache 100 can be partitioned as having 25% of the data cache 101 allocated to integer data for cache portion 110, 65% of the data cache 101 allocated to FP data for cache portion 120, and 10% of data cache 101 allocated to SIMD data for video processing in cache portion 130. In other embodiments and for other target applications, the data cache 101 can be partitioned into other cache portion sizes.

Moreover, the partitioning of data cache 101 does not have to be static. The data cache 101 can be logically partitioned, and the cache portion sizes can be dynamically adjusted based on the microprocessor load and the type of user application or program running on the microprocessor at a particular point in time. For example, under typical usage such as web browsing or word processing, the data cache 101 can be partitioned into equally sized cache portions 110, 120, and 130. But when a user runs a video editing application, the data cache 101 can be dynamically adjusted to partition the data cache 100 as having 25% of the data cache 101 allocated to integer data for cache portion 110, 25% of the data cache 100 allocated to FP data for cache portion 120, and 50% of data cache 101 allocated to SIMD data for video processing in cache portion 130. The partitioning of data cache 101 is returned to equally sized cache portions when the user exits the video editing application. The partitioning of the data cache 101 can be dynamically adjusted using the techniques as described above, for example, by associating different number of page frames to each data-type, by programming different sizes of address ranges for each cache portion, or by mapping more effective addresses to a particular cache portion using the data-type specific memory instructions. Additionally, while the cache portions 110, 120, and 130 are shown to be contiguous in FIG. 1, in other embodiments, the data cache 101 can be partitioned into non-contiguous cache portions.

Thus far, the data cache 101 has discussed as being partitioned into three cache portions 110, 120, and 130. In further embodiments, data cache 101 can be partitioned into any number of cache portions to create finer levels of error protection based on the fault tolerance of the data to be stored in each cache portion and the type of error detection mechanism used to protect the data stored in each cache portion. Other types of data that may have different levels of error protection may include string data, pointer data, and bit-field data, etc. Other exemplary error detection mechanisms in addition to ECCs and parity bits that can be applied to the different cache portions include repetition codes, checksums, cryptographic hash functions, and hybrids of any of these error detection mechanisms. Furthermore, in other embodiments, each cache portion may not be restricted to store only one particular type of data. For example, if both integer data and FP data are critical for a particular user application, then both integer and FP data can be stored in the cache portion 110 which is protected by an ECC error detection mechanism, because both integer and FP data require a high level of protection for this particular user application.

Figure 8:
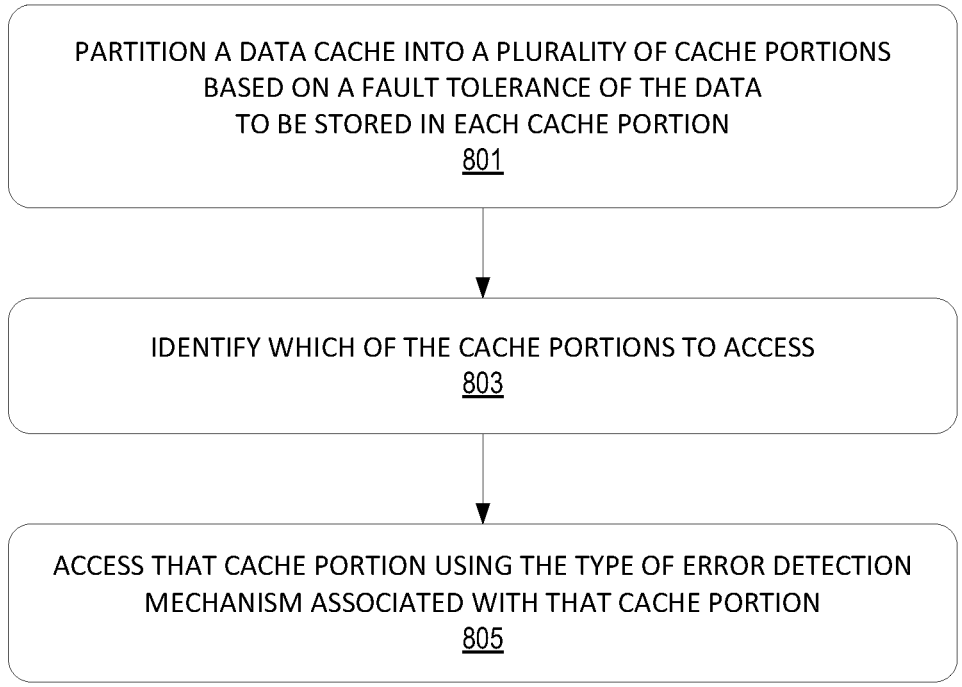
FIG. 8 illustrates a method for reducing data cache access overhead, according to one embodiment of the invention.

FIG. 8 illustrates an embodiment of a method for reducing data cache access overhead. At step 801, a data cache is partitioned into a plurality of cache portions based on the fault tolerance of the data to be stored in each cache portion. The data cache can be partitioned according to any of the embodiments described above. When a data cache access is performed in response to a memory operation, the particular cache portion that is being accessed is identified at step 803. The cache portion corresponding to the data cache access can be identified by looking up a data-type flag in a page table entry or a TLB entry associated with the data cache access. The cache portion corresponding to the data cache access can be also be identified by looking up an effective address associated with the data cache access in an address range buffer to determine which of the cache portions that the effective address is mapped to. Alternatively, the cache portion corresponding to the data cache access can be identified by decoding a protection-level specific memory instruction. Once the particular cache portion corresponding to the data cache access is identified, at step 805, the identified cache portion is accessed using the type of error detection mechanism that is associated with that cache portion. By partitioning the data cache and selectively protecting only certain portion(s) of the data cache with high reliability but costly error detection mechanism such as ECC, the performance and dynamic power consumption of the data cache can be improved.

In another aspect of the present invention, the different cache portions 110, 120, and 130 with the different error detection mechanisms can be operated at different supply voltages to reduce the overall power consumption of the data cache 101. Furthermore, when a cache portion is not being used (e.g., when an executing program does not use the particular type of data that is stored in that cache portion), that cache portion can be dynamically turned off by the cache controller. In one embodiment, at least one of the supply voltages provided to one cache portion is selected to be less than the supply voltage provided to another cache portion based on the fault tolerance of the data to be stored in each respective cache portion. For instance, the cache portion 110 is operated at a supply voltage that is less than or equal to the supply voltage of the cache portion 120, and the supply voltage of the cache portion 120 is less than or equal to the supply voltage of the cache portion 130. More specifically, cache portion 110 may be operated at a supply voltage of 0.8 Volts (V), cache portion 120 may be operated at a supply voltage of 0.9 V, and cache portion 130 may be operated at a supply voltage of 1.0 V. In other embodiments, other supply voltages can be used.

Cache portion 110 can be operated at a low supply voltage because the errors in the stored data that may be caused by operating the cache portion 110 at a low supply voltage are compensated by the error correction capability of the more reliable ECC error protection mechanism used by the cache portion 110. Cache portion 120 can be operated at an intermediate supply voltage because the errors in the stored data that may be introduced by operating the cache portion 120 at an intermediate supply voltage can be detected by the parity bit error protection mechanism used by the cache portion 120. Cache portion 130 is operated at a high supply voltage to prevent supply voltage related errors because errors in the stored data cannot be detected since the cache portion 130 does not use any error protection mechanism to protect its data contents. More generally, the more reliable of an error detection mechanism that is used by a cache portion, the lower of a supply voltage that can be provided to that cache portion.

In a different embodiment, the cache portions 110, 120, and 130 of data cache 101 do not use any error detection mechanism. Nevertheless, by recognizing that the cache portions 110, 120, and 130 store data that has different levels of fault tolerance, the cache portions 110, 120, and 130 can still be operated at different supply voltages to reduce the overall power consumption of the data cache 101. In such an embodiment where the data cache 101 does not use any error detection mechanism, the cache portion that stores data with a lower fault tolerance is operated at a higher supply voltage to prevent voltage-related errors in the data stored in that cache portion. The cache portion that stores data with a higher fault tolerance can be operated at a lower supply voltage because data errors that may be caused by lowering of the supply voltage in that cache portion can be tolerated (i.e. errors do not cause program crashes).

In one embodiment where the data cache 101 does not use any error detection mechanism, the cache portion 110 is operated at a supply voltage that is higher than or equal to the supply voltage of the cache portion 120, and the supply voltage of the cache portion 120 is higher than or equal to the supply voltage of the cache portion 130. For example, cache portion 110 may be operated at a supply voltage of 1.0 Volts (V), cache portion 120 may be operated at a supply voltage of 0.9 V, and cache portion 130 may be operated at a supply voltage of 0.8 V. In other embodiments, other supply voltages can be used.

Cache portion 110 is operated at a high supply voltage because the errors in the stored data in cache portion 110 can cause program crashes. Without using an error detection mechanism to protect the data contents in cache portion 110, cache portion 110 is operated at a high supply voltage to prevent voltage-related errors. Cache portion 120 is operated at an intermediate supply voltage because a few errors in the stored data in cache portion 120 caused by operating the cache portion 120 at an intermediate supply voltage may be tolerable. Cache portion 130 is operated at a low supply voltage because errors in the stored data in cache portion 130 caused by operating the cache portion 130 at a low supply voltage can be tolerated.

Figure 9:
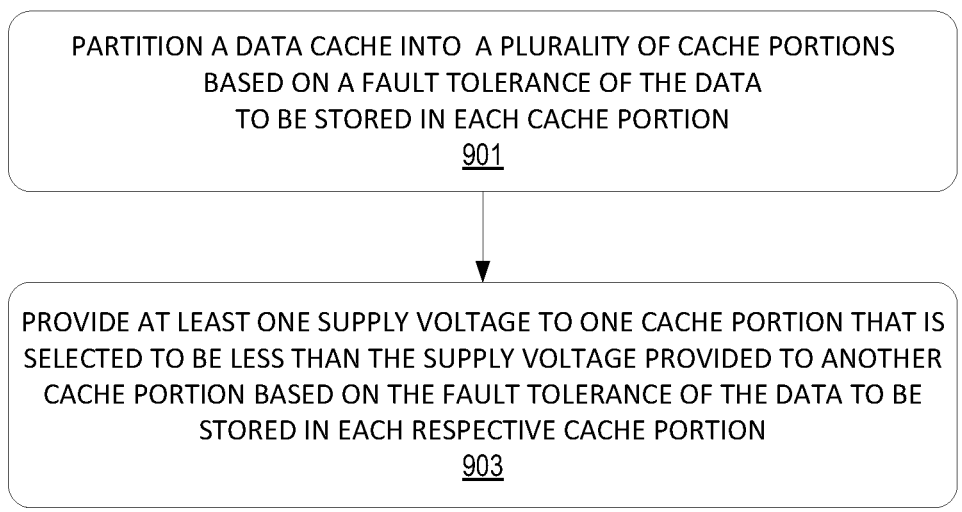
FIG. 9 illustrates a method for reducing power consumption of a data cache, according to one embodiment of the invention.

FIG. 9 illustrates an embodiment of a method for reducing the power consumption of a data cache. At step 901, a data cache is partitioned into a plurality of cache portions based on the fault tolerance of the data to be stored in each cache portion. The data cache can be partitioned according to any of the embodiments described above. At step 903, different supply voltages are provided to each of the cache portions based on the fault tolerance of the type of data to be stored in each respective cache portion. In one embodiment where the data cache does not use any error detection mechanism, the supply voltage provided to the cache portion that stores data with a low fault tolerance (e.g., integer data) is higher than or equal to the supply voltage provided to the cache portion that stores data with an intermediate fault tolerance (e.g., FP data). The supply voltage provided to the cache portion that stores data with an intermediate fault tolerance (e.g., FP data) is higher than or equal to the supply voltage provided to the cache portion that stores data with a high fault tolerance (e.g., SIMD data).

In a different embodiment, an ECC error detection mechanism is applied to the cache portion that stores data with a low fault tolerance (e.g., integer data), and a parity bit error detection mechanism is applied to the cache portion that stores data with an intermediate fault tolerance (e.g., FP data). In this embodiment, the supply voltage provided to the cache portion that stores data with a low fault tolerance (e.g., integer data) is less than or equal to the supply voltage provided to the cache portion that stores data with an intermediate fault tolerance (e.g., FP data). The supply voltage provided to the cache portion that stores data with an intermediate fault tolerance (e.g., FP data) is less than or equal to the supply voltage provided to the cache portion that stores data with a high fault tolerance (e.g., SIMD data). By partitioning the data cache into cache portions based on the fault tolerance of the data stored in each cache portion and providing each cache portion with a different supply voltage, the overall power consumption of the data cache can be reduced, and unused cache portions can also by dynamically turned off.

Exemplary Core Architectures, Processors, and Computer Architectures

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

Exemplary Core Architectures

In-Order and Out-of-Order Core Block Diagram

FIG. 10A is a block diagram illustrating both an exemplary in-order pipeline and an exemplary register renaming, out-of-order issue/execution pipeline according to embodiments of the invention. FIG. 10B is a block diagram illustrating both an exemplary embodiment of an in-order architecture core and an exemplary register renaming, out-of-order issue/execution architecture core to be included in a processor according to embodiments of the invention. The solid lined boxes in FIGS. 10A-B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 10A, a processor pipeline 1000 includes a fetch stage 1002, a length decode stage 1004, a decode stage 1006, an allocation stage 1008, a renaming stage 1010, a scheduling (also known as a dispatch or issue) stage 1012, a register read/memory read stage 1014, an execute stage 1016, a write back/memory write stage 1018, an exception handling stage 1022, and a commit stage 1024.

FIG. 10B shows processor core 1090 including a front end unit 1030 coupled to an execution engine unit 1050, and both are coupled to a memory unit 1070. The core 1090 may be a reduced instruction set computing (RISC) core, a complex instruction set computing (CISC) core, a very long instruction word (VLIW) core, or a hybrid or alternative core type. As yet another option, the core 1090 may be a special-purpose core, such as, for example, a network or communication core, compression engine, coprocessor core, general purpose computing graphics processing unit (GPGPU) core, graphics core, or the like.

The front end unit 1030 includes a branch prediction unit 1032 coupled to an instruction cache unit 1034, which is coupled to an instruction translation lookaside buffer (TLB) 1036, which is coupled to an instruction fetch unit 1038, which is coupled to a decode unit 1040. The decode unit 1040 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1040 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1090 includes a microcode ROM or other medium that stores microcode for certain macroinstructions (e.g., in decode unit 1040 or otherwise within the front end unit 1030). The decode unit 1040 is coupled to a rename/allocator unit 1052 in the execution engine unit 1050.

The execution engine unit 1050 includes the rename/allocator unit 1052 coupled to a retirement unit 1054 and a set of one or more scheduler unit(s) 1056. The scheduler unit(s) 1056 represents any number of different schedulers, including reservations stations, central instruction window, etc. The scheduler unit(s) 1056 is coupled to the physical register file(s) unit(s) 1058. Each of the physical register file(s) units 1058 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1058 comprises a vector registers unit, a write mask registers unit, and a scalar registers unit. These register units may provide architectural vector registers, vector mask registers, and general purpose registers. The physical register file(s) unit(s) 1058 is overlapped by the retirement unit 1054 to illustrate various ways in which register renaming and out-of-order execution may be implemented (e.g., using a reorder buffer(s) and a retirement register file(s); using a future file(s), a history buffer(s), and a retirement register file(s); using a register maps and a pool of registers; etc.). The retirement unit 1054 and the physical register file(s) unit(s) 1058 are coupled to the execution cluster(s) 1060. The execution cluster(s) 1060 includes a set of one or more execution units 1062 and a set of one or more memory access units 1064. The execution units 1062 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 1056, physical register file(s) unit(s) 1058, and execution cluster(s) 1060 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1064). It should also be understood that where separate pipelines are used, one or more of these pipelines may be out-of-order issue/execution and the rest in-order.

The set of memory access units 1064 is coupled to the memory unit 1070, which includes a data TLB unit 1072 coupled to a data cache unit 1074 coupled to a level 2 (L2) cache unit 1076. In one exemplary embodiment, the memory access units 1064 may include a load unit, a store address unit, and a store data unit, each of which is coupled to the data TLB unit 1072 in the memory unit 1070. The instruction cache unit 1034 is further coupled to a level 2 (L2) cache unit 1076 in the memory unit 1070. The L2 cache unit 1076 is coupled to one or more other levels of cache and eventually to a main memory.

By way of example, the exemplary register renaming, out-of-order issue/execution core architecture may implement the pipeline 1000 as follows: 1) the instruction fetch 1038 performs the fetch and length decoding stages 1002 and 1004; 2) the decode unit 1040 performs the decode stage 1006; 3) the rename/allocator unit 1052 performs the allocation stage 1008 and renaming stage 1010; 4) the scheduler unit(s) 1056 performs the schedule stage 1012; 5) the physical register file(s) unit(s) 1058 and the memory unit 1070 perform the register read/memory read stage 1014; the execution cluster 1060 perform the execute stage 1016; 6) the memory unit 1070 and the physical register file(s) unit(s) 1058 perform the write back/memory write stage 1018; 7) various units may be involved in the exception handling stage 1022; and 8) the retirement unit 1054 and the physical register file(s) unit(s) 1058 perform the commit stage 1024.

The core 1090 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1090 includes logic to support a packed data instruction set extension (e.g., AVX1, AVX2), thereby allowing the operations used by many multimedia applications to be performed using packed data.

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

While register renaming is described in the context of out-of-order execution, it should be understood that register renaming may be used in an in-order architecture. While the illustrated embodiment of the processor also includes separate instruction and data cache units 1034/1074 and a shared L2 cache unit 1076, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Specific Exemplary In-Order Core Architecture

Figure 11B:
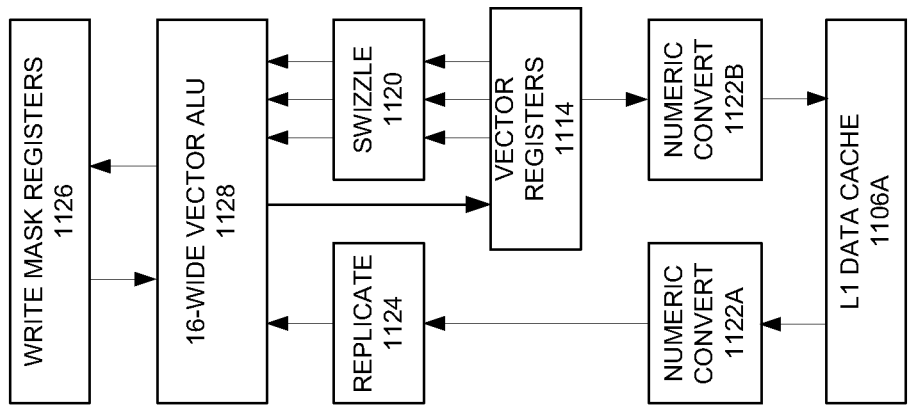
FIG. 11B illustrates an expanded view of part of the processor core, according to embodiments of the invention.
Figure 11A:
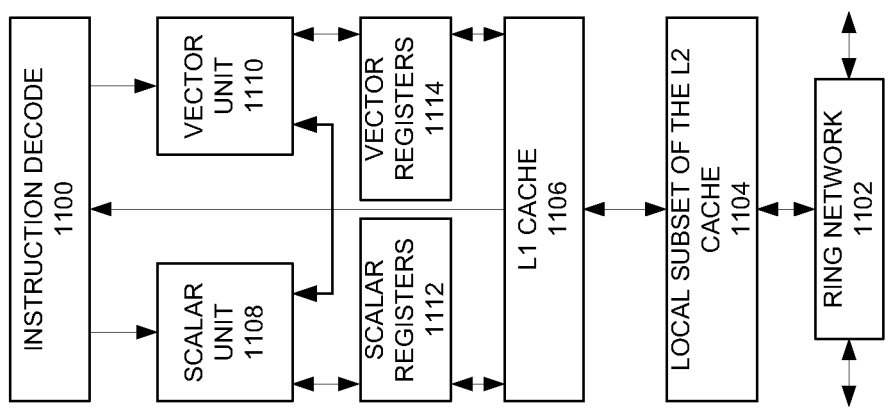
FIG. 11A illustrates a block diagram of a single processor core, along with its connection to the on-die interconnect network and with its local subset of the Level 2 (L2) cache, according to embodiments of the invention.

FIGS. 11A-B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 11A is a block diagram of a single processor core, along with its connection to the on-die interconnect network 1102 and with its local subset of the Level 2 (L2) cache 1104, according to embodiments of the invention. In one embodiment, an instruction decoder 1100 supports the x86 instruction set with a packed data instruction set extension. An L1 cache 1106 allows low-latency accesses to cache memory into the scalar and vector units. While in one embodiment (to simplify the design), a scalar unit 1108 and a vector unit 1110 use separate register sets (respectively, scalar registers 1112 and vector registers 1114) and data transferred between them is written to memory and then read back in from a level 1 (L1) cache 1106, alternative embodiments of the invention may use a different approach (e.g., use a single register set or include a communication path that allow data to be transferred between the two register files without being written and read back).

The local subset of the L2 cache 1104 is part of a global L2 cache that is divided into separate local subsets, one per processor core. Each processor core has a direct access path to its own local subset of the L2 cache 1104. Data read by a processor core is stored in its L2 cache subset 1104 and can be accessed quickly, in parallel with other processor cores accessing their own local L2 cache subsets. Data written by a processor core is stored in its own L2 cache subset 1104 and is flushed from other subsets, if necessary. The ring network ensures coherency for shared data. The ring network is bi-directional to allow agents such as processor cores, L2 caches and other logic blocks to communicate with each other within the chip. Each ring data-path is 1012-bits wide per direction.

FIG. 11B is an expanded view of part of the processor core in FIG. 11A according to embodiments of the invention. FIG. 11B includes an L1 data cache 1106A part of the L1 cache 1104, as well as more detail regarding the vector unit 1110 and the vector registers 1114. Specifically, the vector unit 1110 is a 16-wide vector processing unit (VPU) (see the 16-wide ALU 1128), which executes one or more of integer, single-precision float, and double-precision float instructions. The VPU supports swizzling the register inputs with swizzle unit 1120, numeric conversion with numeric convert units 1122A-B, and replication with replication unit 1124 on the memory input. Write mask registers 1126 allow predicating resulting vector writes.

Processor with Integrated Memory Controller and Graphics

Figure 12:
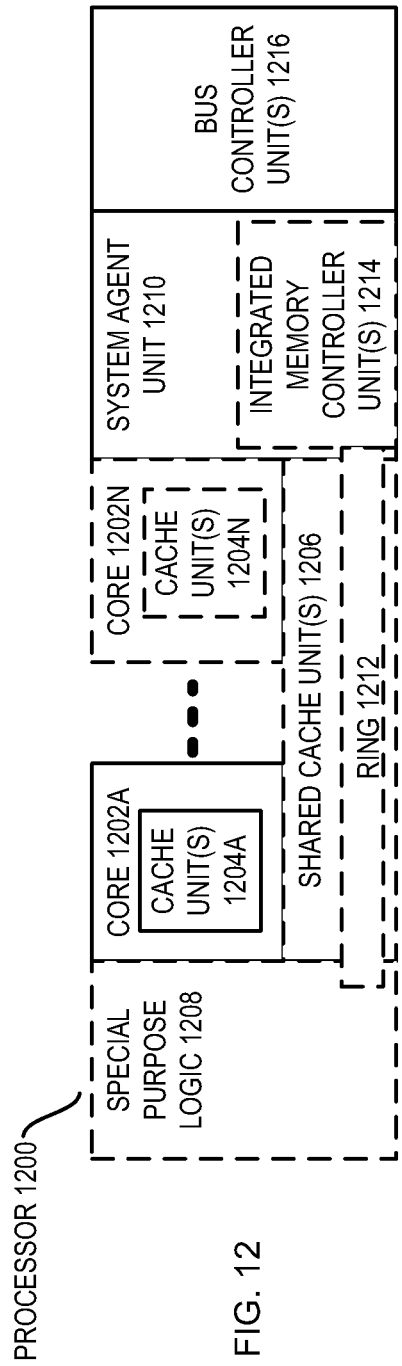
FIG. 12 illustrates a block diagram of a processor that may have more than one core, may have an integrated memory controller, and may have integrated graphics according to embodiments of the invention.

FIG. 12 is a block diagram of a processor 1200 that may have more than one core, may have an integrated memory controller, and may have integrated graphics according to embodiments of the invention. The solid lined boxes in FIG. 12 illustrate a processor 1200 with a single core 1202A, a system agent 1210, a set of one or more bus controller units 1216, while the optional addition of the dashed lined boxes illustrates an alternative processor 1200 with multiple cores 1202A-N, a set of one or more integrated memory controller unit(s) 1214 in the system agent unit 1210, and special purpose logic 1208.

Thus, different implementations of the processor 1200 may include: 1) a CPU with the special purpose logic 1208 being integrated graphics and/or scientific (throughput) logic (which may include one or more cores), and the cores 1202A-N being one or more general purpose cores (e.g., general purpose in-order cores, general purpose out-of-order cores, a combination of the two); 2) a coprocessor with the cores 1202A-N being a large number of special purpose cores intended primarily for graphics and/or scientific (throughput); and 3) a coprocessor with the cores 1202A-N being a large number of general purpose in-order cores. Thus, the processor 1200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1206, and external memory (not shown) coupled to the set of integrated memory controller units 1214. The set of shared cache units 1206 may include one or more mid-level caches, such as level 2 (L2), level 3 (L3), level 4 (L4), or other levels of cache, a last level cache (LLC), and/or combinations thereof. While in one embodiment a ring based interconnect unit 1212 interconnects the integrated graphics logic 1208, the set of shared cache units 1206, and the system agent unit 1210/integrated memory controller unit(s) 1214, alternative embodiments may use any number of well-known techniques for interconnecting such units. In one embodiment, coherency is maintained between one or more cache units 1206 and cores 1202-A-N.

In some embodiments, one or more of the cores 1202A-N are capable of multi-threading. The system agent 1210 includes those components coordinating and operating cores 1202A-N. The system agent unit 1210 may include for example a power control unit (PCU) and a display unit. The PCU may be or include logic and components needed for regulating the power state of the cores 1202A-N and the integrated graphics logic 1208. The display unit is for driving one or more externally connected displays.

The cores 1202A-N may be homogenous or heterogeneous in terms of architecture instruction set; that is, two or more of the cores 1202A-N may be capable of execution the same instruction set, while others may be capable of executing only a subset of that instruction set or a different instruction set.

Exemplary Computer Architectures

FIGS. 13-16 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Figure 13:
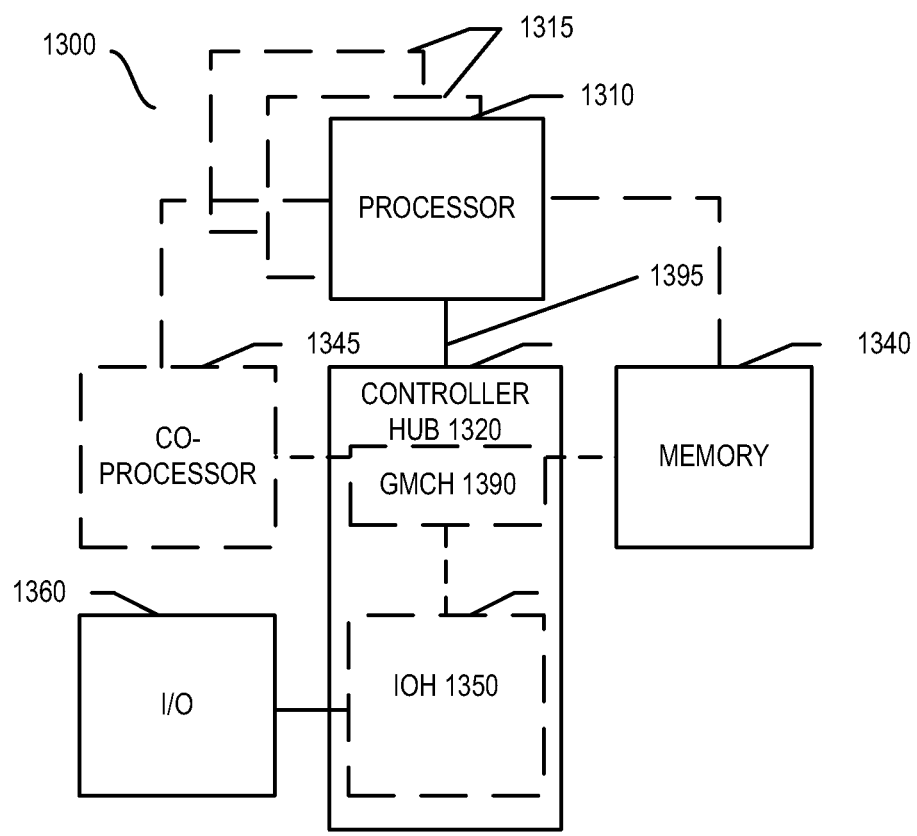
FIG. 13 illustrates a block diagram of a system in accordance with one embodiment of the present invention.

Referring now to FIG. 13, shown is a block diagram of a system 1300 in accordance with one embodiment of the present invention. The system 1300 may include one or more processors 1310, 1315, which are coupled to a controller hub 1320. In one embodiment the controller hub 1320 includes a graphics memory controller hub (GMCH) 1390 and an Input/Output Hub (IOH) 1350 (which may be on separate chips); the GMCH 1390 includes memory and graphics controllers to which are coupled memory 1340 and a coprocessor 1345; the IOH 1350 is couples input/output (I/O) devices 1360 to the GMCH 1390. Alternatively, one or both of the memory and graphics controllers are integrated within the processor (as described herein), the memory 1340 and the coprocessor 1345 are coupled directly to the processor 1310, and the controller hub 1320 in a single chip with the IOH 1350.

The optional nature of additional processors 1315 is denoted in FIG. 13 with broken lines. Each processor 1310, 1315 may include one or more of the processing cores described herein and may be some version of the processor 1200.

The memory 1340 may be, for example, dynamic random access memory (DRAM), phase change memory (PCM), or a combination of the two. For at least one embodiment, the controller hub 1320 communicates with the processor(s) 1310, 1315 via a multi-drop bus, such as a frontside bus (FSB), point-to-point interface such as QuickPath Interconnect (QPI), or similar connection 1395.

In one embodiment, the coprocessor 1345 is a special-purpose processor, such as, for example, a high-throughput MIC processor, a network or communication processor, compression engine, graphics processor, GPGPU, embedded processor, or the like. In one embodiment, controller hub 1320 may include an integrated graphics accelerator.

There can be a variety of differences between the physical resources 1310, 1315 in terms of a spectrum of metrics of merit including architectural, microarchitectural, thermal, power consumption characteristics, and the like.

In one embodiment, the processor 1310 executes instructions that control data processing operations of a general type. Embedded within the instructions may be coprocessor instructions. The processor 1310 recognizes these coprocessor instructions as being of a type that should be executed by the attached coprocessor 1345. Accordingly, the processor 1310 issues these coprocessor instructions (or control signals representing coprocessor instructions) on a coprocessor bus or other interconnect, to coprocessor 1345. Coprocessor(s) 1345 accept and execute the received coprocessor instructions.

Figure 14:
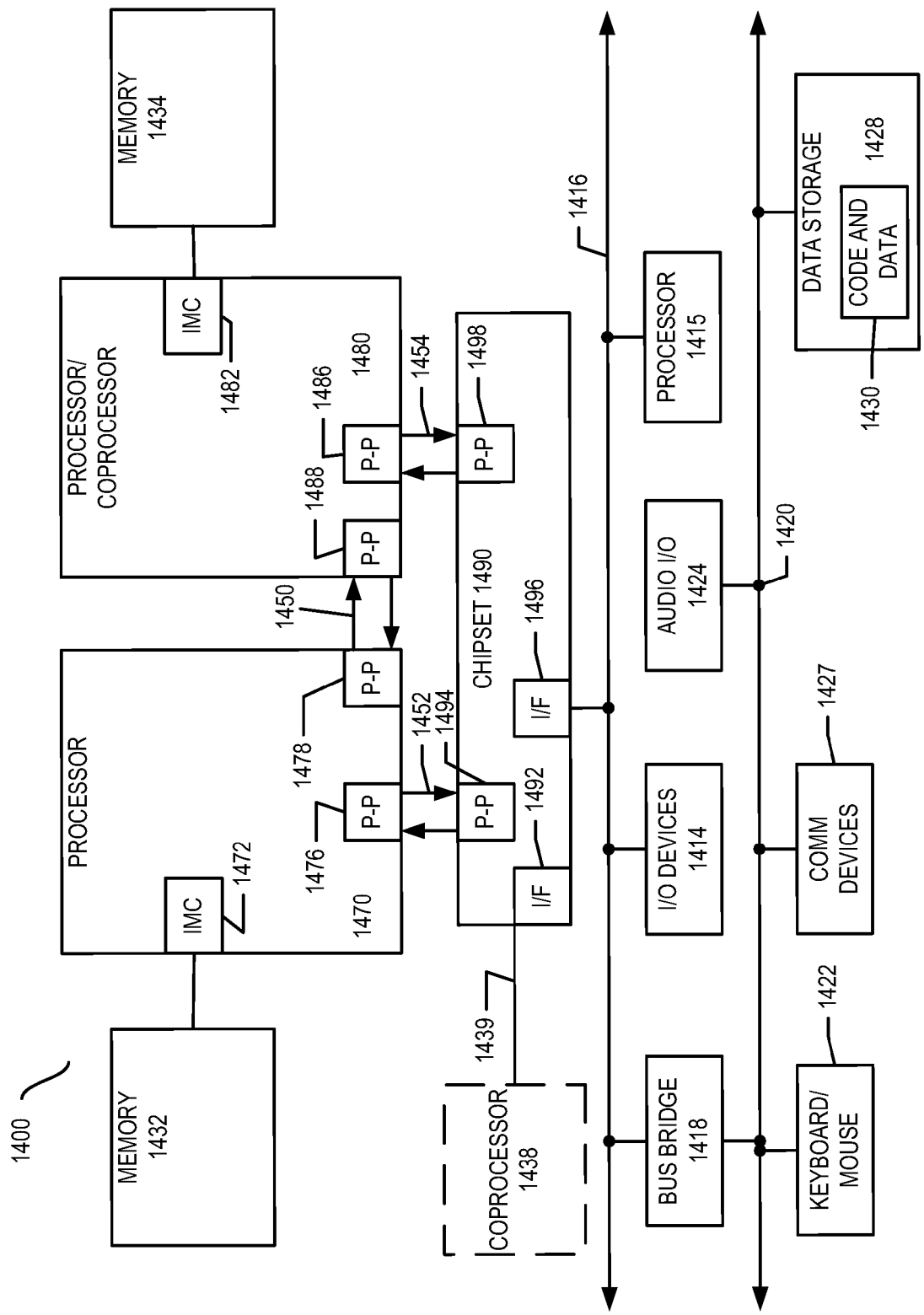
FIG. 14 illustrates a block diagram of a more specific exemplary system in accordance with an embodiment of the present invention

Referring now to FIG. 14, shown is a block diagram of a first more specific exemplary system 1400 in accordance with an embodiment of the present invention. As shown in FIG. 14, multiprocessor system 1400 is a point-to-point interconnect system, and includes a first processor 1470 and a second processor 1480 coupled via a point-to-point interconnect 1450. Each of processors 1470 and 1480 may be some version of the processor 1200. In one embodiment of the invention, processors 1470 and 1480 are respectively processors 1310 and 1315, while coprocessor 1438 is coprocessor 1345. In another embodiment, processors 1470 and 1480 are respectively processor 1310 coprocessor 1345.

Processors 1470 and 1480 are shown including integrated memory controller (IMC) units 1472 and 1482, respectively. Processor 1470 also includes as part of its bus controller units point-to-point (P-P) interfaces 1476 and 1478; similarly, second processor 1480 includes P-P interfaces 1486 and 1488. Processors 1470, 1480 may exchange information via a point-to-point (P-P) interface 1450 using P-P interface circuits 1478, 1488. As shown in FIG. 14, IMCs 1472 and 1482 couple the processors to respective memories, namely a memory 1432 and a memory 1434, which may be portions of main memory locally attached to the respective processors.

Processors 1470, 1480 may each exchange information with a chipset 1490 via individual P-P interfaces 1452, 1454 using point to point interface circuits 1476, 1494, 1486, 1498. Chipset 1490 may optionally exchange information with the coprocessor 1438 via a high-performance interface 1439. In one embodiment, the coprocessor 1438 is a special-purpose processor, such as, for example, a high-throughput MIC processor, a network or communication processor, compression engine, graphics processor, GPGPU, embedded processor, or the like.

A shared cache (not shown) may be included in either processor or outside of both processors, yet connected with the processors via P-P interconnect, such that either or both processors' local cache information may be stored in the shared cache if a processor is placed into a low power mode.

Chipset 1490 may be coupled to a first bus 1416 via an interface 1496. In one embodiment, first bus 1416 may be a Peripheral Component Interconnect (PCI) bus, or a bus such as a PCI Express bus or another third generation I/O interconnect bus, although the scope of the present invention is not so limited.

As shown in FIG. 14, various I/O devices 1414 may be coupled to first bus 1416, along with a bus bridge 1418 which couples first bus 1416 to a second bus 1420. In one embodiment, one or more additional processor(s) 1415, such as coprocessors, high-throughput MIC processors, GPGPU's, accelerators (such as, e.g., graphics accelerators or digital signal processing (DSP) units), field programmable gate arrays, or any other processor, are coupled to first bus 1416. In one embodiment, second bus 1420 may be a low pin count (LPC) bus. Various devices may be coupled to a second bus 1420 including, for example, a keyboard and/or mouse 1422, communication devices 1427 and a storage unit 1428 such as a disk drive or other mass storage device which may include instructions/code and data 1430, in one embodiment. Further, an audio I/O 1424 may be coupled to the second bus 1420. Note that other architectures are possible. For example, instead of the point-to-point architecture of FIG. 14, a system may implement a multi-drop bus or other such architecture.

Figure 15:
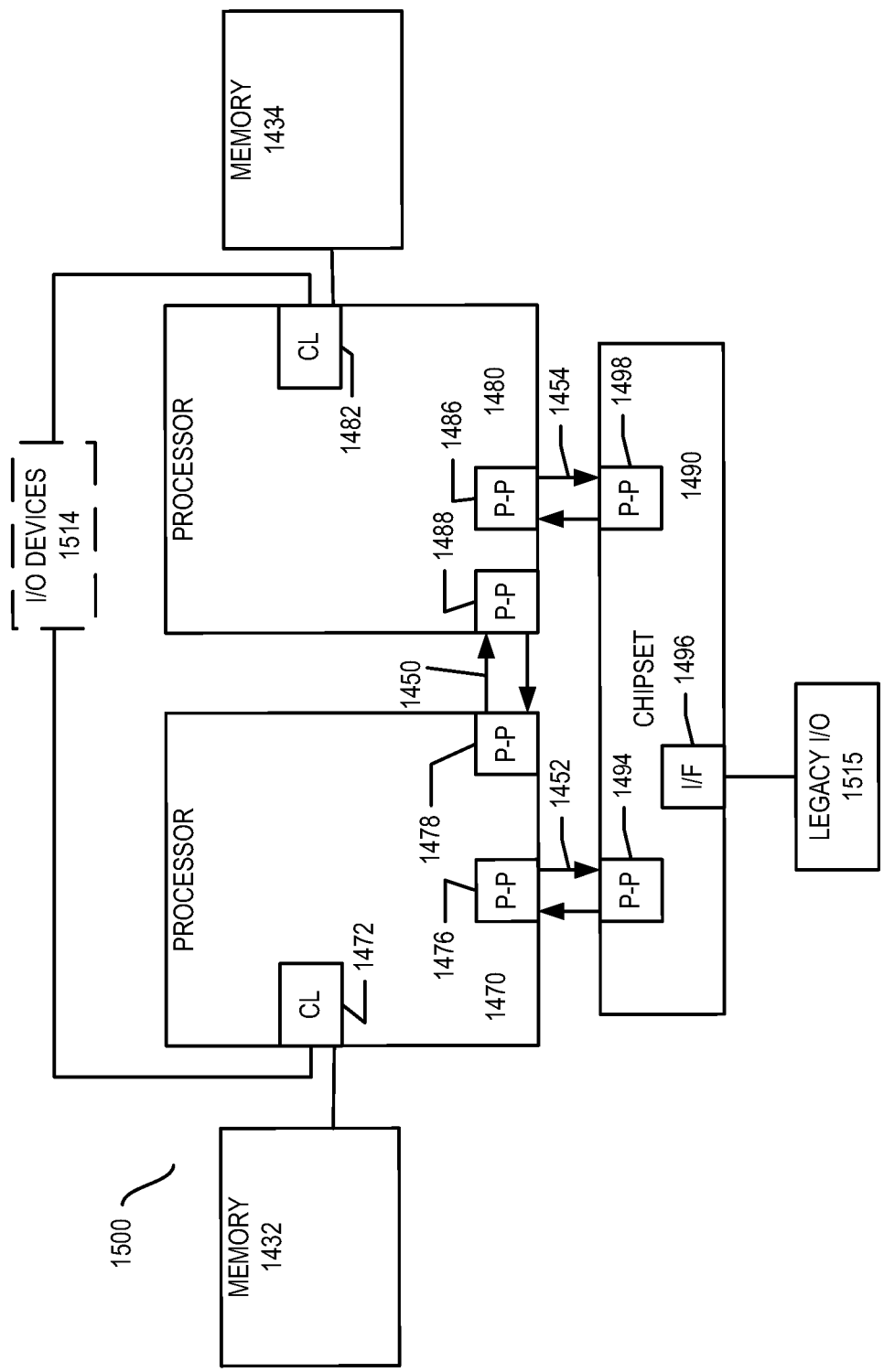
FIG. 15 illustrates a block diagram of another more specific exemplary system in accordance with an embodiment of the present invention

Referring now to FIG. 15, shown is a block diagram of a second more specific exemplary system 1500 in accordance with an embodiment of the present invention. Like elements in FIGS. 14 and 15 bear like reference numerals, and certain aspects of FIG. 14 have been omitted from FIG. 15 in order to avoid obscuring other aspects of FIG. 15.

FIG. 15 illustrates that the processors 1470, 1480 may include integrated memory and I/O control logic ("CL") 1472 and 1482, respectively. Thus, the CL 1472, 1482 include integrated memory controller units and include I/O control logic. FIG. 15 illustrates that not only are the memories 1432, 1434 coupled to the CL 1472, 1482, but also that I/O devices 1514 are also coupled to the control logic 1472, 1482. Legacy I/O devices 1515 are coupled to the chipset 1490.

Figure 16:
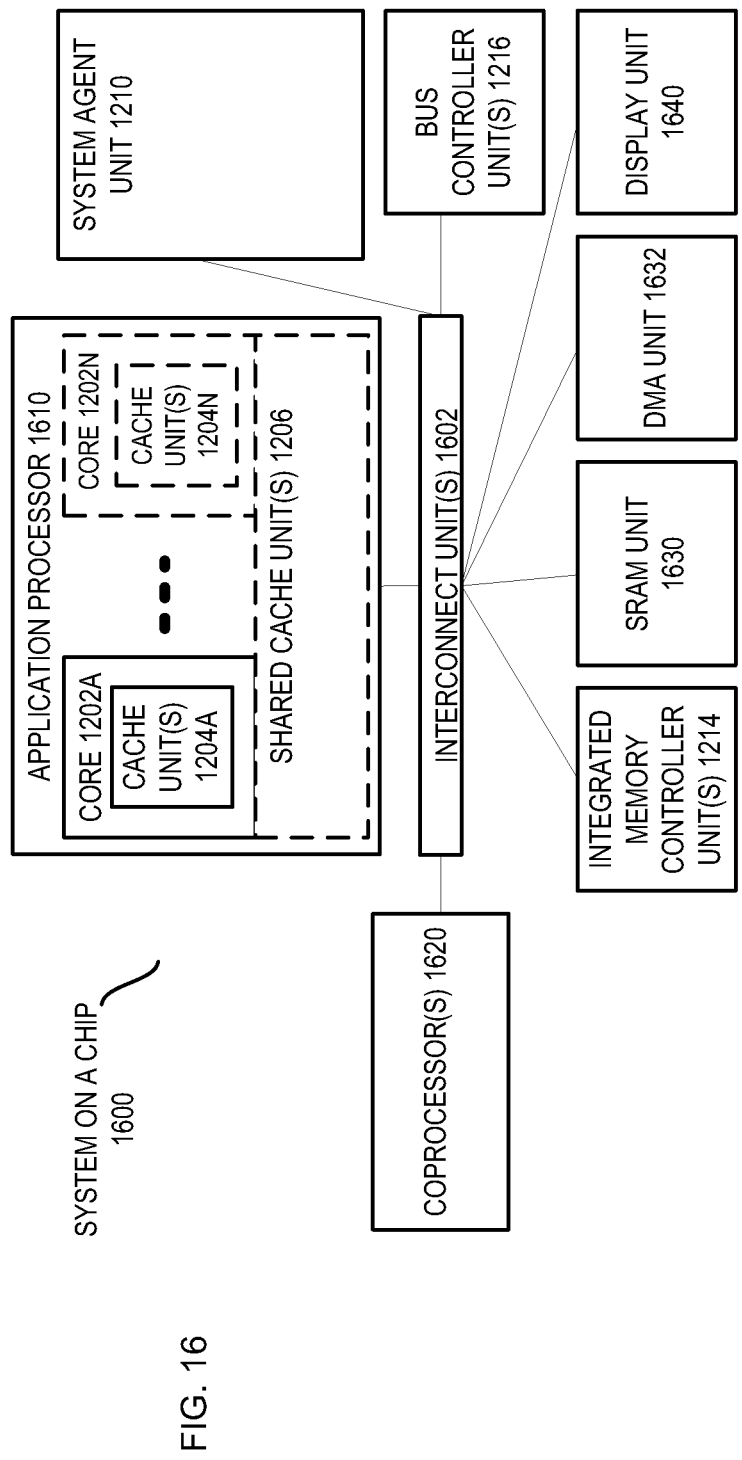
FIG. 16 illustrates a block diagram of a SoC in accordance with an embodiment of the present invention.

Referring now to FIG. 16, shown is a block diagram of a SoC 1600 in accordance with an embodiment of the present invention. Similar elements in FIG. 12 bear like reference numerals. Also, dashed lined boxes are optional features on more advanced SoCs. In FIG. 16, an interconnect unit(s) 1602 is coupled to: an application processor 1610 which includes a set of one or more cores 202A-N and shared cache unit(s) 1206; a system agent unit 1210; a bus controller unit(s) 1216; an integrated memory controller unit(s) 1214; a set or one or more coprocessors 1620 which may include integrated graphics logic, an image processor, an audio processor, and a video processor; an static random access memory (SRAM) unit 1630; a direct memory access (DMA) unit 1632; and a display unit 1640 for coupling to one or more external displays. In one embodiment, the coprocessor(s) 1620 include a special-purpose processor, such as, for example, a network or communication processor, compression engine, GPGPU, a high-throughput MIC processor, embedded processor, or the like.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code, such as code 1430 illustrated in FIG. 14, may be applied to input instructions to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of the invention also include non-transitory, tangible machine-readable media containing instructions or containing design data, such as Hardware Description Language (HDL), which defines structures, circuits, apparatuses, processors and/or system features described herein. Such embodiments may also be referred to as program products.

Emulation (Including Binary Translation, Code Morphing, Etc.)

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

Figure 17:
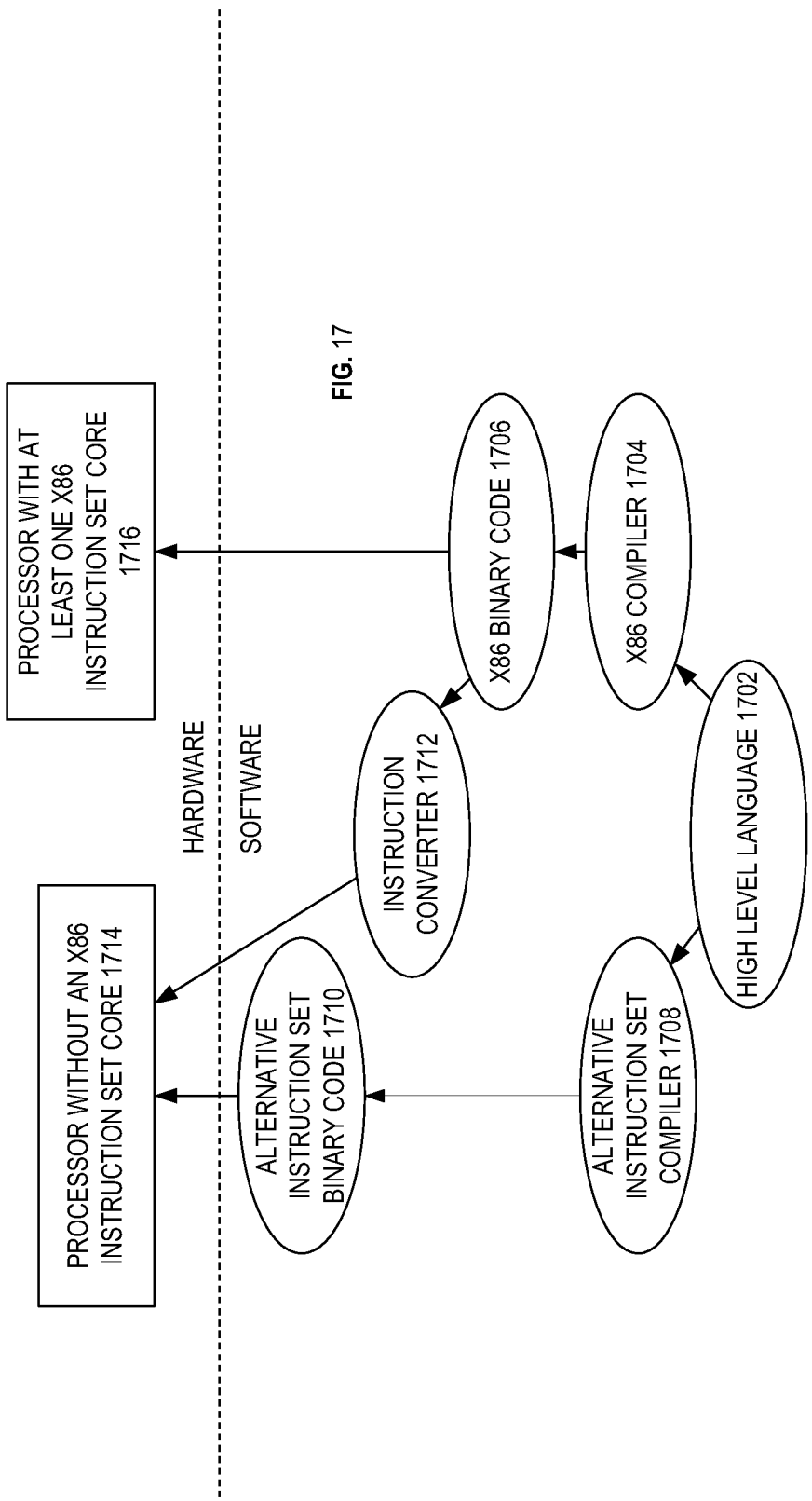
FIG. 17 illustrates a block diagram contrasting the use of a software instruction converter to convert binary instructions in a source instruction set to binary instructions in a target instruction set according to embodiments of the invention.

FIG. 17 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 17 shows a program in a high level language 1702 may be compiled using an x86 compiler 1704 to generate x86 binary code 1706 that may be natively executed by a processor with at least one x86 instruction set core 1716. The processor with at least one x86 instruction set core 1716 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1704 represents a compiler that is operable to generate x86 binary code 1706 (e.g., object code) that can, with or without additional linkage processing, be executed on the processor with at least one x86 instruction set core 1716. Similarly, FIG. 17 shows the program in the high level language 1702 may be compiled using an alternative instruction set compiler 1708 to generate alternative instruction set binary code 1710 that may be natively executed by a processor without at least one x86 instruction set core 1714 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1712 is used to convert the x86 binary code 1706 into code that may be natively executed by the processor without an x86 instruction set core 1714. This converted code is not likely to be the same as the alternative instruction set binary code 1710 because an instruction converter capable of this is difficult to make; however, the converted code will accomplish the general operation and be made up of instructions from the alternative instruction set. Thus, the instruction converter 1712 represents software, firmware, hardware, or a combination thereof that, through emulation, simulation or any other process, allows a processor or other electronic device that does not have an x86 instruction set processor or core to execute the x86 binary code 1706.

Embodiments of the mechanisms disclosed herein may be implemented in hardware, software, firmware, or a combination of such implementation approaches. Embodiments of the invention may be implemented as computer programs or program code executing on programmable systems comprising at least one processor, a storage system (including volatile and non-volatile memory and/or storage elements), at least one input device, and at least one output device.

Program code may be applied to input data to perform the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks (compact disk read-only memories (CD-ROMs), compact disk rewritables (CD-RWs)), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

Accordingly, embodiments of the invention also include non-transitory, tangible machine-readable media containing instructions the vector friendly instruction format or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

The above description is intended to illustrate preferred embodiments of the present invention. From the discussion above it should also be apparent that especially in such an area of technology, where growth is fast and further advancements are not easily foreseen, the invention can may be modified in arrangement and detail by those skilled in the art without departing from the principles of the present invention within the scope of the accompanying claims and their equivalents. For example, one or more operations of a method may be combined or further broken apart.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate embodiments of the invention. The scope of the invention is not to be determined by the specific examples provided above but only by the claims below.

What is claimed is:

1. An apparatus comprising:
    a data cache comprising:
        a first cache portion to store a first data;
        a second cache portion to store a second data; and
        a third cache portion to store a third data,
        wherein a first type of error detection code is used to protect the first data,
        a second type of error detection code is used to protect the second data, and
        the third data is unprotected; and
    an error detection code generation circuitry to generate at least one of the first and second types of error detection code.

2. The apparatus of claim 1, wherein the first data includes integer data, and the first type of error detection code is an Error Correcting Code (ECC).

3. The apparatus of claim 1, wherein the second data includes floating-point (FP) data, and the second type of error detection code is a parity bit.

4. The apparatus of claim 1, wherein the third data includes Single Instruction Multiple Data (SIMD) data.

5. The apparatus of claim 1, further comprising:
    a translation look-aside buffer (TLB) to store page table entries that indicate virtual-to-physical address translations corresponding to page frames, wherein each page table entry includes a data-type flag to identify the cache portion that is associated with the page frame of that page table entry.

6. The apparatus of claim 1, further comprising:
    a plurality of address range buffers, wherein each address range buffer is associated with a context, and each address range buffer is to store, for each of the cache portions, a range of addresses that is mapped to that cache portion.

7. The apparatus of claim 1, further comprising;
    a hardware decoder to decode protection-level specific memory instructions; and
    execution logic to perform accesses to the cache portions based on the protection-level specific memory instructions.

8. The apparatus of claim 1, wherein the first cache portion has a first supply voltage, the second cache portion has a second supply voltage, and the third cache portion has a third supply voltage, and wherein the first supply voltage is less than or equal to the second supply voltage, and the second supply voltage is less than or equal to the third supply voltage.

9. The apparatus of claim 1, wherein the data cache is a first level data cache.

10. A method comprising:
    partitioning a data cache into a plurality of cache portions based on a fault tolerance of data to be stored in each cache portion;
    performing a data cache access comprising:
        determining which of the cache portions to access; and
        accessing that cache portion using a type of error detection mechanism that is associated with that cache portion.

11. The method of claim 10, wherein the plurality of cache portions include a first cache portion for storing integer data, a second cache portion for storing floating-point (FP) data, and a third cache portion for storing Single Instruction Multiple Data (SIMD) data.

12. The method of claim 11, wherein the step of accessing includes:
    accessing the first cache portion using an Error Correcting Code (ECC) error detection mechanism.

13. The method of claim 11, wherein the step of accessing includes:
    accessing the second cache portion using a parity bit error detection mechanism.

14. The method of claim 11 wherein the step of accessing includes:
    accessing the third cache portion without performing error detection.

15. The method of claim 10, wherein the step of determining which of the cache portions to access includes:
    looking up a data-type flag in a page table entry associated with the data cache access.

16. The method of claim 10, wherein the step of determining which of the cache portions to access includes:
    looking up an address associated with the data cache operation in an address range buffer to determine which of the cache portions that the address is mapped to.

17. The method of claim 10, wherein the step of determining which of the cache portions to access includes:
    decoding a protection-level specific memory instruction.

18. A method comprising:
    partitioning a data cache into a plurality of cache portions based on a fault tolerance of data to be stored in each cache portion; and
    providing at least one supply voltage to one cache portion that is less than another supply voltage that is provided to another cache portion based on the fault tolerance of the data to be stored in each respective cache portion.

19. The method of claim 18, wherein the plurality of cache portions include a first cache portion for storing integer data, a second cache portion for storing floating-point (FP) data, and a third cache portion for storing Single Instruction Multiple Data (SIMD) data.

20. The method of claim 19, wherein the step of providing different supply voltages to the cache portions includes:
providing a first supply voltage to the first cache portion;
providing a second supply voltage to the second cache portion; and
providing a third supply voltage to the third cache portion, wherein the first supply voltage is higher than or equal to the second supply voltage, and the second supply voltage is higher than or equal to the third supply voltage.

21. The method of claim 19, further comprising:
applying an Error Correcting Code (ECC) error detection mechanism to the first cache portion; and
applying a parity bit error detection mechanism to the second cache portion; and
wherein the step of providing different supply voltages to the cache portions include:
providing a first supply voltage to the first cache portion;
providing a second supply voltage to the second cache portion; and
providing a third supply voltage to the third cache portion, wherein the first supply voltage is less than or equal to the second supply voltage, and the second supply voltage is less than or equal to the third supply voltage.

22. The method of claim 18, further comprising:
dynamically turning off one of the cache portions when the data corresponding to that cache portion is not being used.

* * * * *